US011877409B2

(12) United States Patent
Grabowski et al.

(10) Patent No.: US 11,877,409 B2
(45) Date of Patent: Jan. 16, 2024

(54) MODULE CARRIER IN THE FIELD OF SECONDARY EXPLOSION PROTECTION

(71) Applicant: TURCK Holding GmbH, Halver (DE)

(72) Inventors: Franz Grabowski, Xanten (DE); Adalbert Gabrysch, Dorsten (DE)

(73) Assignee: TURCK HOLDING GMBH, Halver (DE)

(*) Notice: Subject to any disclaimer, the term of this patent is extended or adjusted under 35 U.S.C. 154(b) by 0 days.

(21) Appl. No.: 17/475,966

(22) Filed: Sep. 15, 2021

(65) Prior Publication Data

US 2022/0132686 A1    Apr. 28, 2022

(30) Foreign Application Priority Data

Oct. 22, 2020   (DE) .................... 10 2020 127 795.4

(51) Int. Cl.
*H05K 5/02*   (2006.01)
(52) U.S. Cl.
CPC ................... *H05K 5/0208* (2013.01)
(58) Field of Classification Search
CPC ........................................................ H05K 7/00
See application file for complete search history.

(56) References Cited

U.S. PATENT DOCUMENTS

| | | | | |
|---|---|---|---|---|
| 3,094,920 A | * | 6/1963 | Priesmeyer | A01K 43/10 101/41 |
| 9,201,518 B2 | * | 12/2015 | Wang | G06F 3/03543 |
| 2006/0028442 A1 | * | 2/2006 | Bynum | G06F 3/0317 345/157 |
| 2006/0274042 A1 | * | 12/2006 | Krah | G06F 3/03543 345/163 |

* cited by examiner

*Primary Examiner* — Jerry Wu
(74) *Attorney, Agent, or Firm* — Amster, Rothstein & Ebenstein LLP

(57) ABSTRACT

A module carrier for use in a potentially explosive atmosphere, in particular in a potentially explosive atmosphere in the form of gas or dust, including a housing for receiving at least one module with a pushbutton, wherein the at least one module can be switched to live via the pushbutton, wherein the module carrier further includes a locking cap, wherein the locking cap has a device for actuating the pushbutton and wherein, in the unactuated state, the pushbutton is switched to not live and the pushbutton is actuatable by locking the locking cap using the actuating device.

10 Claims, 3 Drawing Sheets

MODULE CARRIER IN THE FIELD OF SECONDARY EXPLOSION PROTECTION

CROSS REFERENCE TO RELATED APPLICATIONS

This application claims priority to German application no, DE 10 2020 127 795.4, filed Oct. 22, 2020, the content of which is incorporated by reference herein in its entirety.

FIELD OF INVENTION

The present invention relates to a module carrier with at least one module, in particular a power supply unit, for use in an explosion-risk area. In particular, the invention relates to a module carrier with at least one module which has an increased level of safety when used in potentially explosive atmospheres, in particular in a potentially explosive atmosphere in the form of gas or dust.

BACKGROUND OF RELATED PRIOR ART

In the context of secondary explosion protection, for instance in potentially explosive atmospheres in the form of gas or dust, the aim is to avoid effective ignition sources. Above all, electric arcs and sparks are also taken into account as ignition sources.

One approach here provides that the wires and contacts in question are mechanically non-releasably fixed. Another approach provides that, before the contacts are opened or closed, the wires are switched to currentless, with the result that no sparking or arcing can occur.

For example, the excom system from Turck represents a valuable contribution to the state of the art. Here, the power supply unit is switched to currentless, and only after being plugged in is the device switched to live by means of an inductive switch by screwing in and locking a threaded bolt.

SUMMARY

The object of the invention is to develop a power supply unit for use in an explosion-risk area which is easy to operate and reliable.

This object is achieved according to the invention by the features of claim 1. Advantageous embodiments are specified in the dependent claims.

Accordingly, the object is achieved by a module carrier for use in a potentially explosive atmosphere, comprising a housing for receiving at least one module with a pushbutton, wherein the at least one module can be switched to live via the pushbutton. The module carrier further comprises a locking cap, wherein the locking cap has a device for actuating the pushbutton. In the unactuated state, the pushbutton is switched to not live and the pushbutton is actuatable by locking the locking cap using the actuating device.

It can thereby be advantageously ensured that the module is switched to not live before it the module is removed. The module can thereby also be disassembled, for example, from an electrical enclosure in potentially explosive atmospheres, without the need to switch larger areas of a plant to currentless for this purpose.

The module carrier is accordingly provided with an electromechanical device which prevents the module, in particular a power supply unit, from being able to be unplugged or plugged in when live. For this purpose, the locking cap is provided with a device for actuating an electromechanical pushbutton.

The module carrier of the invention can furthermore advantageously be produced more cost-effectively than in the case of the solution to date, for instance with a locking screw and an inductive switch.

The module carrier can furthermore have a particularly advantageous user friendliness, as well as a clearly and easily detectable surface feel, which further facilitates operation. Furthermore, a particularly quick operability with short unlocking and locking times can be guaranteed.

The invention combines, in particular through an electromechanical approach, a mechanical fixing and an electrical connection or disconnection of the live conductor.

This makes it possible for instance to replace the module in a zone 2 hazardous area during operation.

In an embodiment, the module is a power supply unit module. The operation of a particularly relevant module, which requires particular safety measures in a potentially explosive atmosphere, is thereby advantageously facilitated.

Furthermore, it can be provided that supply connections of the module, in particular of the power supply unit, are designed in the manner of the explosion protection "Increased safety Ex ec".

Furthermore, for example, a HotPlug function in a zone 2 hazardous area can be performed without interrupting the power supply.

The pushbutton can in particular be formed as an electromechanical pushbutton switch. It can furthermore be formed as an actuating switch.

The pushbutton is formed in particular with a "Normally Open" (NO) logic, i.e. a circuit is closed when the pushbutton is actuated and is opened as long as the pushbutton is not actuated. The pushbutton with the "Normally Open" switch logic is thus not live in the unactuated state.

In the case of the module carrier, an actuation of the pushbutton using the actuating device has the result in particular that the module is switched to live, in particular by closing a circuit using the pushbutton.

In particular, the pushbutton is formed such that it switches an inherently safe release circuit, which switches the module, in particular a power supply unit module or a PSM24 module, to live or currentless in particular via at least one relay.

In an embodiment, the housing has a cage element. The cage element is in particular formed to receive the module and at least partially surround it on its edge. For example, the cage element can surround the module to the extent that, when a locking cap is fitted, only the connection of the module is accessible for installation at an electronic slot, for instance in order to plug the module in at a slot.

The locking cap can be formed as a front plate. It is formed in particular to conceal the module from an outside user when installed in the module carrier. The locking cap thus has to be removed in order to be able to remove the module, for instance by unplugging it from a slot.

In an embodiment, the locking cap has at least one snap hook. In particular, two or more snap hooks are provided. It can be provided that the snap hooks engage with a housing of the module carrier, for instance a cage element, and thus lock the locking cap in place. In this case, the locking cap is firmly connected to the housing or cage element until at least one of the snap hooks is released.

The locking cap can furthermore be formed and provided with a snap hook such that, after snapping into place, the locking cap is locked in place on the module lying underneath and the actuating pushbutton in the inherently safe circuit is actuated.

In an embodiment, when the locking cap is locked, the pushbutton lies behind the locking cap behind a module cap, which is blocked by the locking cap. The pushbutton is thereby advantageously protected against unintentional actuation or opening.

The module cap is in particular formed such that it covers the front side of the module or at least partially receives an area pointing towards the user on the front side of the module. The module cap is in particular formed such that the user cannot take the module out of the module carrier without removing the module cap.

The module cap can be arranged between the module and the locking cap.

The device provided on the locking cap for actuating the pushbutton is therefore in particular formed such that in the locked-in-place state it can actuate the pushbutton through the module cap, for instance through a recess or opening.

In particular, the module cap can be formed such that it engages with the at least one cage element. The module cap and the cage element could be releasably connected to each other, for instance by a snap-on connection or a locking.

The pushbutton is, for example, arranged on the PSM24 power supply unit module behind the locking cap or behind the module cap and is thus protected against unintentional actuation.

In an embodiment, the locking cap covers the module in the locked state such that, under the locking cap, the module is not releasable. The locking cap is in particular formed such that the module, for instance a power supply unit module, is covered such that the module arranged under the locking cap cannot be released.

For example, the locking cap is arranged such that it blocks an unplugging or another movement of the module and makes it substantially impossible.

In an embodiment, the module carrier is formed such that removing the module and the locking cap from the module carrier at the same time is ruled out by design. In particular, the locking cap always has to be released from the locked-in-place state first, wherein the actuation of the pushbutton is ended; only then is it possible to remove the module as well. It is thereby advantageously ensured that the module is always removed in a not live state.

In particular, simultaneously removing the module, in particular the power supply unit module or the PSM24 power supply unit module, together with the locking cap from the module carrier is ruled out by design.

In an embodiment, the pushbutton switches an inherently safe release circuit, which switches the module to live or currentless via at least one relay. A particularly safe switchover between the live and not live state of the module is thereby advantageously achieved.

In an embodiment, the locking cap is designed translucent. In particular, an inscription and/or status display lying underneath is visible from the outside through the locking cap. For example, light signals can be used to emit signals of the module and to make, for instance, information about the operating state detectable.

BRIEF DESCRIPTION OF THE DRAWINGS

Further details and advantages of the invention will now be explained in more detail with reference to an embodiment example represented in the drawings.

There are shown in.

DETAILED DESCRIPTION

Figure 1:
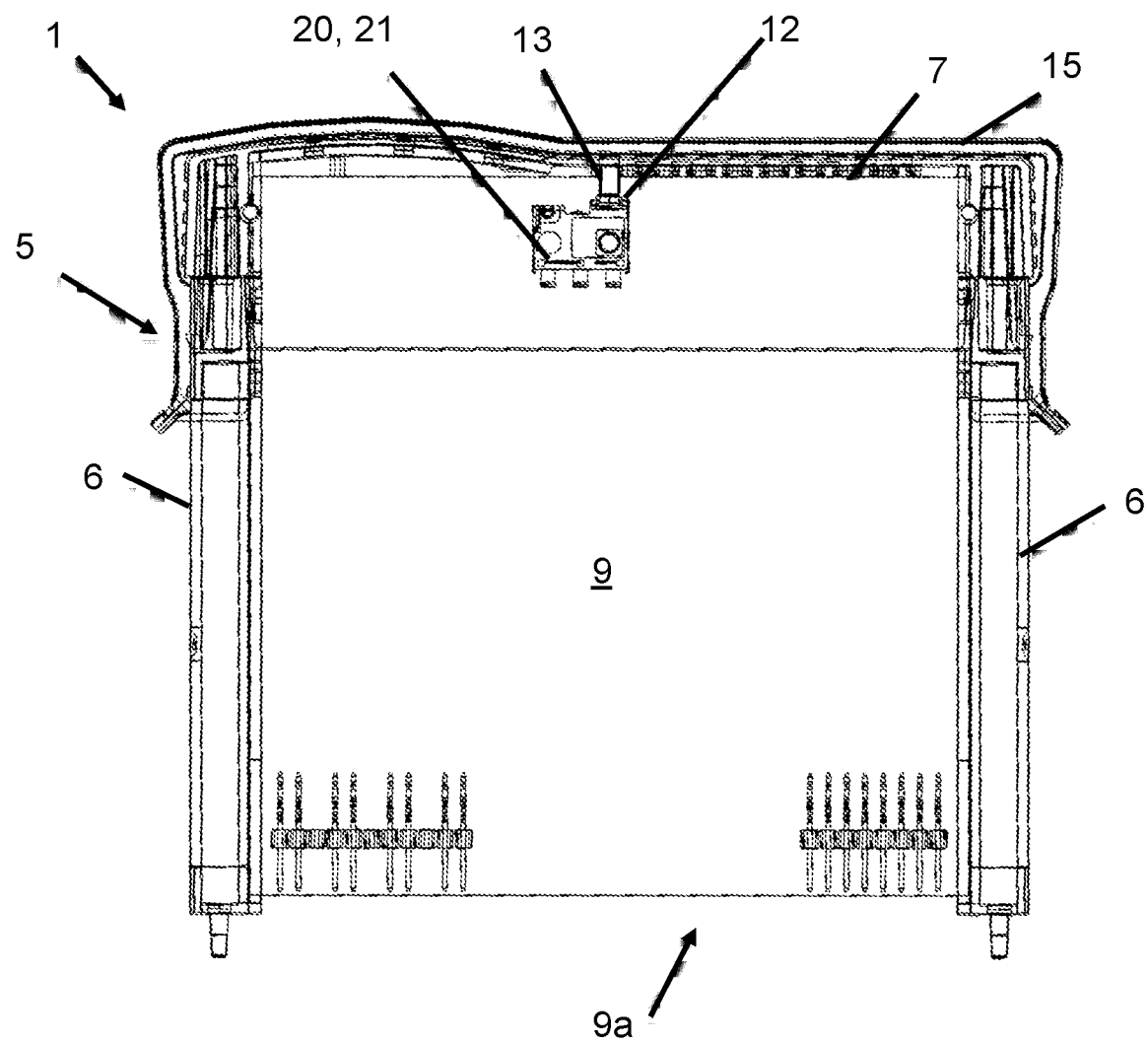
FIG. 1 a schematic view of a module carrier including a housing with a locking cap, the module carrier containing a power module, which is in a locked-in-place state within the housing by the locking cap.
Figure 1A:
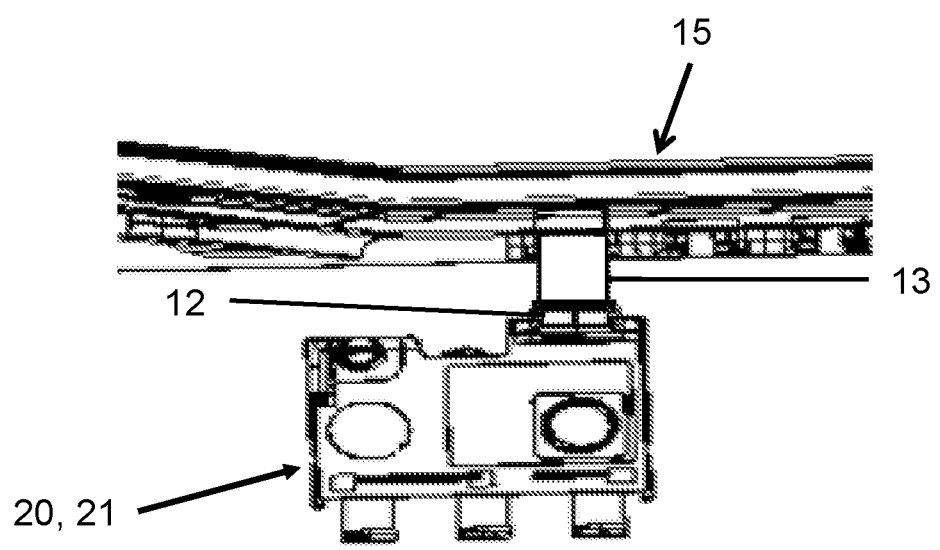
FIG. 1A is an enlarged partial view of FIG. 1 illustrating an actuating device of the locking cap interfacing with a pushbutton of the power module.

An embodiment example of the module carrier with a module is explained with reference to FIGS. 1 to 3.

The module carrier 1 comprises a housing 5. In the case shown the module 9 is received in the housing 5.

The module 9 here is a power supply unit module 9, in particular a PSM24 module.

The module 9 is installed in the module carrier 1, by being pushed into a slot for example with a plug-in side 9a. Electrical contacts of the module 9 are hereby connected to electrical contacts of the slot.

In the embodiment example, the housing 5 comprises two lateral cage elements 6, which are arranged along the sides of the module 9 arranged substantially perpendicular to the plug-in side 9a of the module 9 and between which the module 9 can be pushed in.

The housing 5 furthermore comprises a module cap 7 which, in the case shown, receives the side of the module 9 facing away from the plug-in side 9a.

In the embodiment example, the lateral cage elements 6 and the module cap 7 are connected by means of detents, with the result that the module cap 7 is secured against accidental release from the lateral cage elements 6. In particular, it is thereby ensured that the module 9 cannot be removed without previously removing the module cap 7.

In the embodiment example, the lateral cage elements 6 are set up to be firmly connected to a substrate to the side of a slot for the module 9. They thereby form guides which make it easier to push the module 9 into the slot.

The module carrier 1 furthermore comprises a locking cap 15, which is formed following the contour of a module cap 7.

The locking cap 15 has a bow-shaped design and is mounted via the module cap 7.

Figure 3:
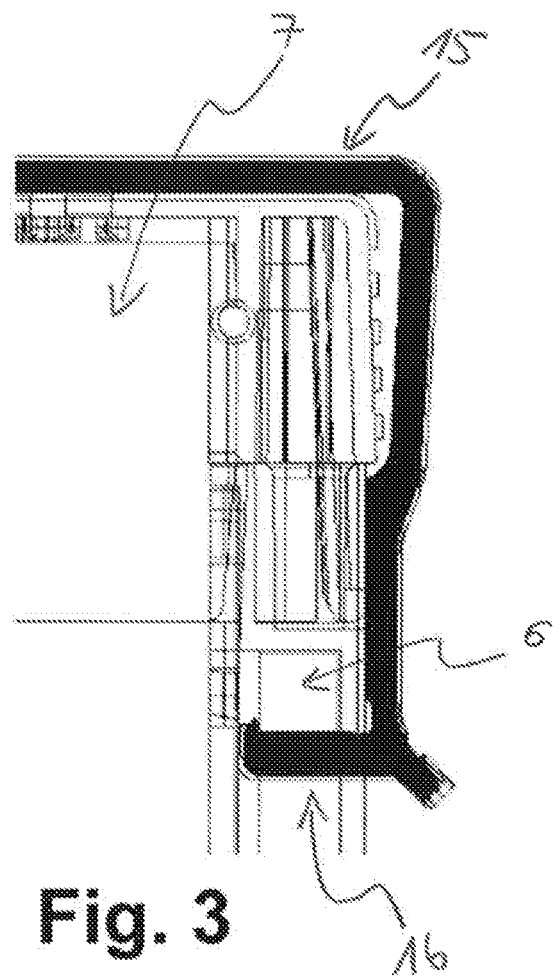
FIG. 3 a detail view of the module carrier with locking element locked in place.
Figure 2:
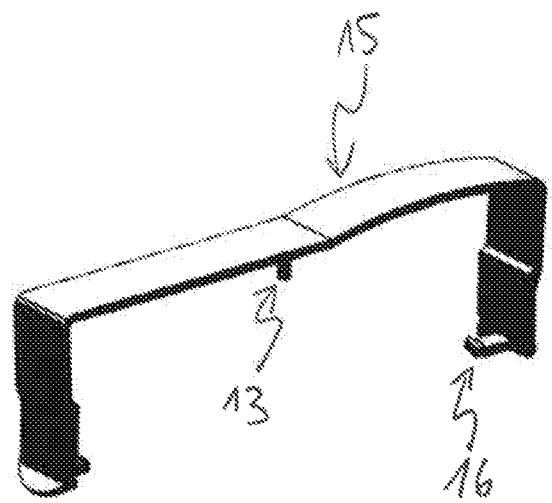
FIG. 2 a locking cap in a released state.

Referring to FIGS. 2 and 3, the two opposite sides of the locking cap 15 each have a snap hook 16, which can selectively snap into place on the lateral cage elements 6, which thereby prevents an accidental release of the locking cap 15. In this state, the locking cap 15 is locked in place on the side facing away from the plug-in side, i.e., on the front face of the module 9. The locking cap 15 can be released again only if the snap hooks 16 are released beforehand.

The locking cap 15 furthermore conceals the front face of the module 9 as well as of the module cap 7.

The locking cap 15 covers the module 9 in the locked state in such a way that the module 9 under the locking cap 15 is not releasable. Conversely, this means that the module 9 can be released and in particular removed from a slot only if the locking cap 15 is removed beforehand.

In addition, removing the module 9 and the locking cap 15 from the module carrier 1 at the same time is ruled out by design. In particular, the locking cap cannot be removed together with the module 9 in its locked or locked-in-place state. The locking of the locking cap 15 therefore has to be released first in order to be able to remove the module 9 from the module carrier 1.

The locking cap 15 furthermore has an actuating device 13. This actuating device 13 lies behind the locking cap 15 when the locking cap 15 is locked.

In the example, it is formed as a pin or elongate projection which protrudes from the locking cap 15 and extends towards the module 9.

In particular, the locking cap 15, the snap hooks 16 and the actuating device 13 are formed in one piece, for instance in a plastic part.

If the locking cap is locked in place on the module carrier 1 with the module 9, then the actuating device 13 is pressed in the direction of the module 9 and in the process actuates a pushbutton 12, which is comprised by the module 9.

In particular, the module cap 7 has a recess or opening through which the actuating device (e.g., pin) 13 can reach the pushbutton 12 of the module 9 and actuate said pushbutton.

Conversely, the pushbutton 12 is no longer actuated when the locking cap 15 is removed.

The pushbutton 12 is formed such that a circuit is closed when it is actuated, i.e. when pressure is exerted on the pushbutton 12. In the embodiment example, the pushbutton 12 switches an inherently safe release circuit 20, which switches the module 9 to live or currentless via a relay 21.

The module 9 is set up in order that it is only live while the pushbutton 12 is being actuated.

Conversely, the circuit is opened when the pushbutton 12 is not actuated, in particular when the locked state is released and the locking cap 15 is removed. As the pushbutton 12 is then no longer actuated, the module 9 is also in a not live state.

As the locking cap 15 has to be released in order to be able to remove the module 9, it is therefore ensured that the module 9 is first brought into a not live state before the module 9 can then be removed.

In further embodiment examples, other embodiments of the actuating device 13 are provided. Furthermore, various types of pushbuttons 12 can be provided. For example, a magnetically and/or inductively actuatable pushbutton 12 or an alternative switch can be provided; the pushbutton 12 can furthermore be formed differently from a conventional pushbutton switch. According to the type of pushbutton 12, the actuating device 13 is formed such that it actuates the pushbutton 12 when the locking cap 15 is locked in place on the module carrier 1.

In particular, the pushbutton 12 or an alternative switch is formed such that the module 9 is only switched to live during the actuation by the actuating element 13 of the locking cap 15.

In the installed state of the module carrier 1 the locked-in-place locking cap 15 conceals the view of the front side of the module cap 7 and of the module 9 from a user. In the embodiment example, the locking cap 15 is formed translucent, with the result that for instance inscriptions of the module cap 7 and/or of the module 9 are visible and light signals and status displays can be detected, for instance the light of an LED.

With the module carrier 1 according to the invention it is accordingly achieved that the module 9 in an installed state is fixed by a locked-in-place locking cap 15. In the process an actuating device 13 actuates a pushbutton 12 of the module 9 as long as the locking cap 15 is locked in place. Through this actuation the module 9 is switched to live. To disassemble the module 9, the locking cap 15 first has to be released from being locked in place. This leads to the deactivation of the pushbutton 12 and thus to the switching of the module 9 into a currentless state. Only then can the module 9 be removed.

LIST OF REFERENCE NUMBERS

1 module carrier
5 housing
6 lateral cage element
7 module cap
9 module; power supply unit module
9a plug-in side
12 pushbutton
13 actuating device for the pushbutton 12
15 locking cap
16 snap hooks
20 release circuit
21 relay

We claim:

1. A module carrier for use in a potentially explosive atmosphere in a form of gas or dust, comprising:
a housing configured for receiving a module having a pushbutton, the housing including two lateral cage elements between which the module is selectively inserted, the module being switchable between a live state and a non-live state via the pushbutton, the pushbutton being arranged to switch an intrinsically safe release circuit, which is mounted on and switches the module to the live state or the non-live state;
wherein the module carrier further comprises a selectively detachable locking cap with one or more fasteners configured to lock with at least one of the lateral cage elements and secure the module within the housing, a module cap positioned over the module wherein, when the locking cap is positioned over the module cap and locked to the housing, the pushbutton and the module cap are inaccessible until the locking cap is removed from the housing;
wherein the locking cap has an actuating device extending through an opening in the module cap for actuating the pushbutton when the locking cap is attached to the housing; and
wherein in an unactuated state of the pushbutton, the locking cap is detached from the housing and the module is switched to the non-live state, and wherein the pushbutton is actuatable to switch the module to the live state only by attaching the locking cap to the housing in a locked-in-place state so that the actuating device engages the pushbutton.

2. The module carrier according to claim 1, wherein the module is a power supply unit module.

3. The module carrier according to claim 1, wherein the one or more fasteners includes at least one snap hook configured to releasably engage the at least one of the lateral cage elements.

4. The module carrier according to claim 1, wherein the locking cap covers the module in the locked-in-place state such that, under the locking cap, the module is not releasable.

5. The module carrier according to claim 1, wherein the housing and the locking cap are configured to prohibit removal of the module from the module carrier, wherein the module is removable from the housing only after the locking cap is removed from the housing.

6. The module carrier according to claim 1, wherein the locking cap is translucent.

7. The module carrier according to claim 1, wherein the actuating device is a pin extending in a direction sufficient to engage with the pushbutton.

8. The module carrier according to claim 3, wherein the locking cap, the at least one snap hook and the actuating device are formed as a one-piece unit.

9. The module carrier according to claim 1, wherein the pushbutton includes normally open logic circuitry (NOLC) in which the NOLC is closed when the pushbutton is actuated and is open when the pushbutton is not actuated.

10. The module carrier according to claim 1, wherein the intrinsically safe release circuit switches the module to the live state or the non-live state via a relay.

\* \* \* \* \*